(12) United States Patent
Nielsen et al.

(10) Patent No.: US 9,791,530 B2
(45) Date of Patent: Oct. 17, 2017

(54) METHOD OF MRI IMAGING USING NON-SLICE-SELECTIVE, SPATIALLY TAILORED TIP-UP PULSE

(71) Applicant: The Regents of the University of Michigan, Ann Arbor, MI (US)

(72) Inventors: Jon-Fredrik Nielsen, Huntington Woods, MI (US); Daehyun Yoon, Ann Arbor, MI (US); Douglas C. Noll, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 1224 days.

(21) Appl. No.: 13/861,524

(22) Filed: Apr. 12, 2013

(65) Prior Publication Data

US 2013/0271134 A1 Oct. 17, 2013

Related U.S. Application Data

(60) Provisional application No. 61/624,280, filed on Apr. 14, 2012.

(51) Int. Cl.
*G01V 3/00* (2006.01)
*G01R 33/54* (2006.01)
(Continued)

(52) U.S. Cl.
CPC ........... *G01R 33/54* (2013.01); *G01R 33/565* (2013.01); *G01R 33/5614* (2013.01)

(58) Field of Classification Search
CPC .................................................. G01R 33/565
(Continued)

(56) References Cited

U.S. PATENT DOCUMENTS

| 4,480,228 A | * | 10/1984 | Bottomley | ........... | G01R 33/485 |
|---|---|---|---|---|---|
| | | | | | 324/307 |
| 2003/0003053 A1 | * | 1/2003 | Uetake | ............... | G01R 33/4828 |
| | | | | | 424/9.3 |
| 2006/0139027 A1 | * | 6/2006 | Dreher | ................. | G01R 33/485 |
| | | | | | 324/307 |

FOREIGN PATENT DOCUMENTS

FR   WO 2009053770 A1 *  4/2009 ....... G01R 33/56563
WO   WO2014154461 A1   10/2014

OTHER PUBLICATIONS

Jakob Assländer et al.; Spin Echo Formation with a Phase Pre-Winding Pulse; Proc. Intl. Soc. Mag. Reson. Med. 21 (2013) p. 4249; Dept. of Radiology—Medical Physics, University Medical Center Freiburg, Freiburg, Germany.
(Continued)

*Primary Examiner* — Louis Arana
(74) *Attorney, Agent, or Firm* — Howard & Howard Attorneys PLLC

(57) ABSTRACT

A method of acquiring image data with an MRI system from an object using a sequence of tip-down and tip-up RF pulses is described. A slice-selective first pulse α rotates the in-slice spins from the longitudinal axis (z) toward a transverse plane (x, y). Image data is acquired from the in-slice spins during a free precession interval ($T_{free}$) in which the in-slice spins precess along the transverse plane (x, y). A spatially tailored, non-slice-selective second pulse $\beta(\vec{r})$ is applied for rotating the in-slice spins from the transverse plane (x, y) to at least substantially along the longitudinal axis (z). A third pulse S may be applied to the in-slice and out-of-slice spins to eliminate (spoil) residual transverse signal from out-of-slice spins.

20 Claims, 5 Drawing Sheets

(51) Int. Cl.
*G01R 33/565* (2006.01)
*G01R 33/561* (2006.01)

(58) Field of Classification Search
USPC .......................................... 324/309, 307, 300
See application file for complete search history.

(56) References Cited

OTHER PUBLICATIONS

Oliver Bieri et al.; SSFP Signal With Finite RF Pulses; Magnetic Resonance in Medicine 62, (2009) pp. 1232-1241.
William A. Grissom et al.; Fast Large-Tip-Angle Multidimensional and Parallel RF Pulse Design in MRI. IEEE Transactions on Medical Imaging, vol. 28, No. 10; (2009) pp. 1548-1559.
Shaihan J. Malik et al.; Tailored Excitation In 3D With Spiral Nonselective (SPINS) RF Pulses. Magnetic Resonance in Medicine 67, (2012) pp. 1303-1315.
Jon-Fredrik Nielsen et al.; Small-Tip Fast Recovery Imaging Using Non-Slice-Selective Tailored Tip-Up Pulses And Radiofrequency-Spoiling. Magnetic Resonance in Medicine 69, (2013) pp. 657-666.
John Pauly et al.; Parameter Relations for the Shinnar-Le Roux Selective Excitation Pulse Design Algorithm. IEEE Transactions on Medical Imaging, vol. 10, No. 1; (1991) pp. 53-65.
Greg J. Stanisz et al., $T_1$, $T_2$ Relaxation And Magnetization Transfer In Tissue At 3T. Magnetic Resonance in Medicine 54, (2005) pp. 507-512.
Hao Sun et al.; Strategies For Improved 3D Small-Tip Fast Recovery Imaging; Magnetic Resonance in Medicine; 72; (2014); pp. 389-398.
Hao Sun et al.; Steady-State Functional MRI Using Spoiled Small-Tip Fast Recovery Imaging; Magnetic Resonance in Medicine; 73; (2015) pp. 536-543.
Feng Zhao et al.; Simultaneous Fat Saturation And Magnetization Transfer Preparation With 2D Small-Tip Fast Recovery Imaging; Proc. Intl. Soc. Mag. Reson. Med. 21; (2013) p. 2507.
Jon-Fredrik Nielsen et al.; Small-Tip Fast Recovery Imaging Using Non-Slice-Selective Tailored Tip-Up Pulses And Radiofrequency-Spoiling; Magnetic Resonance in Medicine 2013; pp. 657-666.
Karla L. Miller et al.; Modeling SSFP Functional MRI Contrast in the Brain; Magnetic Resonance in Medicine 60; (2008); pp. 661-673.
Stefan K. Piechnik et al; Modelling vascular reactivity to investigate the basis of the relationship between cerebral blood volume and flow under $CO_2$ manipulation. NeuroImage 39; (2008) pp. 107-118.
E. Mark Haacke et al; In Vivo Measurement of Blood Oxygen Saturation Using Magnetic Resonance Imaging: A Direct Validation of the Blood Oxygen Level-Dependent Concept in Functional Brain Imaging. Human Brain Mapping 5; (1997); pp. 341-346.
O. Bieri et al.; Analysis and Compensation of Eddy Currents in Balanced SSFP. Magnetic Resonance in Medicine 54; (2005); pp. 129-137.
Jon-Fredrik Nielsen et al; Interleaved Balanced SSFP Imaging: Artifact Reduction Using Gradient Waveform Grouping. Journal of Magnetic Resonance Imaging 29; (2009) pp. 745-50.
Chun-Yu Yip et al.; Iterative RF Pulse Design for Multidimensional, Small-Tip-Angle Selective Excitation. Magnetic Resonance in Medicine 54; (2005) pp. 908-917.
Jon-Fredrik Nielsen; Dynamic Perfusion Imaging With Near-Optimal SNR Efficiency Using Arterial Spin Labeling And A Parallel Transmit/Receive Array; NIH Exploratory/Developmental Grant Resubmission (1 R21 EB015091-01); Mar. 16, 2012; pp. 11.

\* cited by examiner

METHOD OF MRI IMAGING USING NON-SLICE-SELECTIVE, SPATIALLY TAILORED TIP-UP PULSE

CROSS REFERENCE TO RELATED APPLICATIONS

The present application claims priority from U.S. Provisional Application Ser. No. 61/624,280, filed Apr. 14, 2012, which is herein incorporated by reference.

GOVERNMENT LICENSE RIGHTS

This invention was made with government support under EB012674 and NS058576 awarded by the National Institutes of Health. The government has certain rights in the invention.

BACKGROUND OF THE INVENTION

1. Field of the Invention

The subject invention generally relates to a method of acquiring image data with a magnetic resonance imaging (MRI) system. More particularly, the invention relates to a method of acquiring image data using a sequence of radio frequency (RF) pulses for steady-state MRI.

2. Description of the Related Art

In magnetic resonance imaging (MRI), an MRI system includes a field magnet which is energized to produce a substantially homogeneous static magnetic (B0) field through a bore in which an object, typically a human body, is placed. The object includes a plurality of atomic nuclei, typically belonging to hydrogen atoms, within organic matter such as tissue, bones, etc. Each of the atomic nuclei exhibits an intrinsic angular momentum and spins about an axis. The magnetic moment of each of the atomic nuclei is known as a spin. The B0 field induces the spins to align according to a longitudinal axis defined by the B0 field. The MRI system includes an RF transmitter which temporarily applies an RF pulse to the object to rotate the spins away from the longitudinal axis. Thereafter, the spins precess (rotate) around the longitudinal axis with a frequency proportional to the local B0 field. Gradually, the spins realign to the longitudinal axis as a result of longitudinal relaxation (T1) and transverse relaxation (T2). In so doing, the spins release a detectable nuclear magnetic resonance (NMR) signal. The MRI system includes gradient coils which generate and temporarily apply magnetic field gradients to the object for determining the spatial location of the spins. The MRI system conventionally includes an RF receiver for receiving the NMR signal released by the spins. The MRI system processes the NMR signals to form part of an image corresponding to a scanned region of the object. The MRI system repeatedly applies RF pulses and magnetic field gradients along several slices of the scanned region to construct the entire image of the scanned region.

The sequence of RF pulses and magnetic field gradients may be repeated every "TR" milliseconds, where TR is an abbreviation for "sequence repetition time." If TR is relatively shorter in duration than the transverse relaxation time T2, the spins will not have sufficient time to realign to the longitudinal axis prior to the application of each RF pulse. As a result, the spins generally settle into a dynamic steady-state, which is generally a function of tissue relaxation parameters (T1, T2) and of imaging sequence parameters, such as flip angle and sequence repetition time TR. Some of the advantages of steady-state MRI are that the image can be acquired rapidly, and that useful image contrast can be achieved with proper choice of RF and field gradient waveforms.

One common method of steady-state MRI imaging is balanced steady-state free precession (bSSFP) imaging. Balanced SSFP utilizes RF pulses combined with balanced magnetic field gradients, i.e., gradients which act on spins between consecutive RF pulses and preserve the phase of the spins existing before application of the gradient. Balanced SSFP can provide high signal-to-noise ratio (SNR) efficiency and useful T1-weighted and T2-weighted image contrast. Unfortunately, bSSFP imaging suffers from considerable signal loss as a consequence of local B0 inhomogeneity. Specifically, a significant loss of SNR and useful image contrast occurs in regions where the B0 frequency offset is an odd integer multiple of one-half of the inverse of the sequence repetition time, TR. Consequently, dark bands may be present in the image, which is undesirable and limits the application of bSSFP.

Accordingly, there remains an opportunity to provide an MRI imaging technique which mitigates the effects of local resonance frequency offset and eliminates signal variations.

SUMMARY OF THE INVENTION AND ADVANTAGES

The invention provides a method of acquiring image data with an MRI system from an object according to a plurality of slices. The object includes a plurality of in-slice spins within each respective slice and a plurality of out-of-slice spins outside each respective slice. The method includes the step applying a magnetic field (B0) to the object to align the in-slice spins and the out-of-slice spins along a longitudinal axis (z). A first pulse $\alpha$ is applied to the in-slice spins for rotating the in-slice spins from the longitudinal axis (z) toward a transverse plane (x, y). Image data is acquired from the in-slice spins during a free precession interval ($T_{free}$) in which the in-slice spins precess in the transverse plane (x, y). A second pulse $\beta(\vec{r})$ is applied to the in-slice spins for rotating the in-slice spins from the transverse plane (x, y) to at least substantially along the longitudinal axis (z).

The invention advantageously interrupts precession of the in-slice spins in transverse plane (x, y) by applying the second pulse $\beta(\vec{r})$ to rotate the in-slice spins toward the longitudinal axis (z). As such, longitudinal magnetization is rapidly and accurately reestablished before reapplication of the method of acquiring image data. Accordingly, SNR efficiency is improved and erroneous scans and repeats are minimized. Furthermore, the invention reduces cost by increasing initial scan quality thereby minimizing unnecessary additional scans.

The method further provides an MRI imaging technique which does not suffer from considerable signal loss and/or reduction in the SNR ratio. A significant amount of the NMR signal released by the in-slice spins is captured by realignment of the in-slice spins to the longitudinal axis (z) by the second pulse $\beta(\vec{r})$. Additionally, the second pulse $\beta(\vec{r})$ accurately tailors excitation of the spins to the local B0 inhomogeneity over the imaging volume. Thus, the effects of resonance frequency offset are mitigated thereby reducing signal variations due to resonance frequency offset.

The method further allows the second pulse $\beta(\vec{r})$ to be non-slice-selective, even when the imaging region is of finite spatial extent, such as a thin 2D slice. The use of a non-slice-selective second pulse $\beta(\vec{r})$ makes it possible to implement the second pulse $\beta(\vec{r})$ using fast RF and gradient waveforms. If a corresponding slice-selective second pulse $\beta(\vec{r})$ were required, the pulse duration of $\beta(\vec{r})$ would be prohibitively long for many applications.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
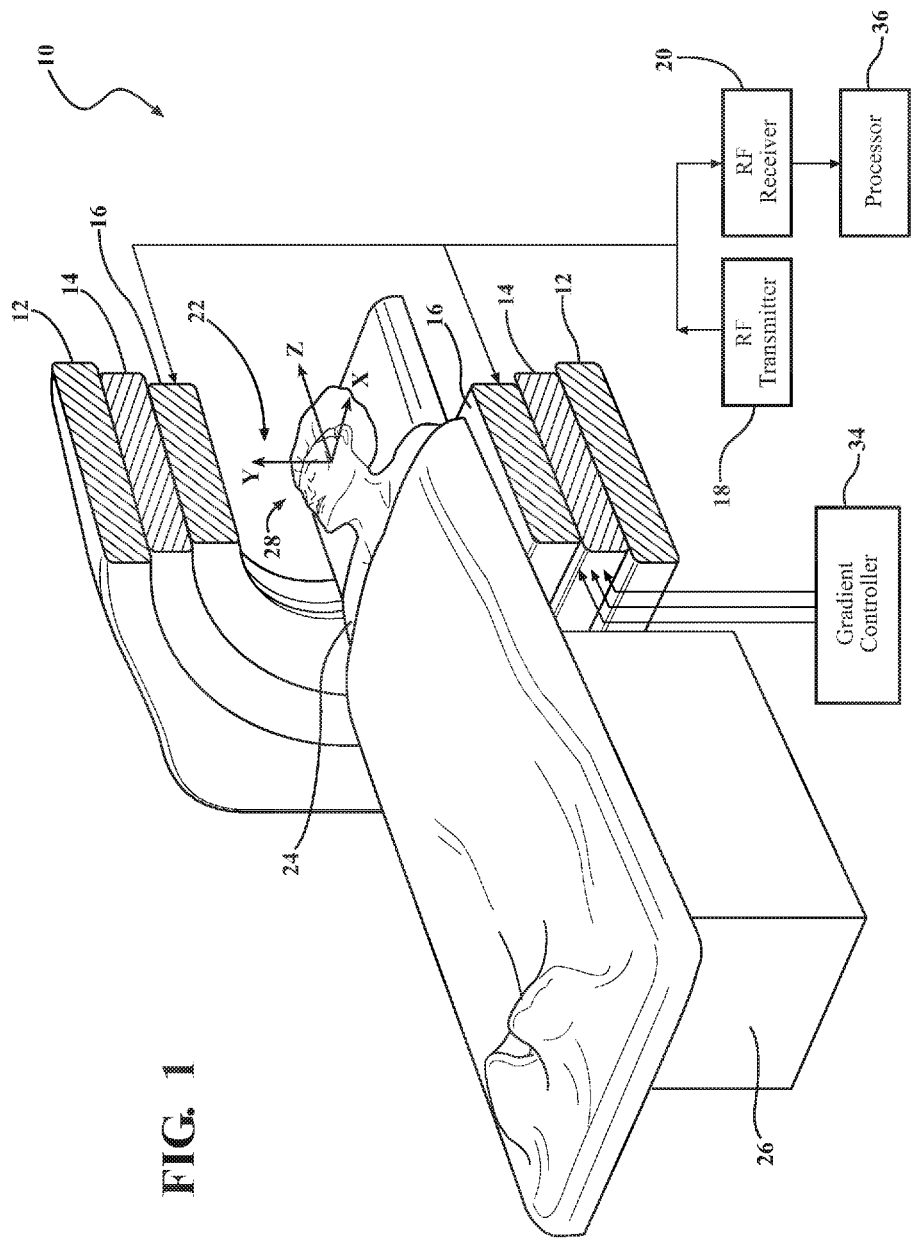
FIG. 1 is a perspective view of an MRI system, partially in cross-section, for implementing a method of acquiring image data from an object.

Referring to the Figures, wherein like numerals indicate corresponding parts throughout the several views, an MRI system is generally shown at 10 in FIG. 1. The MRI system 10 generally includes a field magnet 12, a set of gradient coils 14, an RF coil 16, an RF transmitter 18, and an RF receiver 20. The field magnet 12 has a coaxial cylindrical configuration and defines a bore 22 therein. An object 24, typically a human body, is disposed on a support 26 which is moveable within the bore 22. The gradient coils 14 and the RF coil 16 are disposed within the bore 22 of the field magnet 12.

Figure 6:
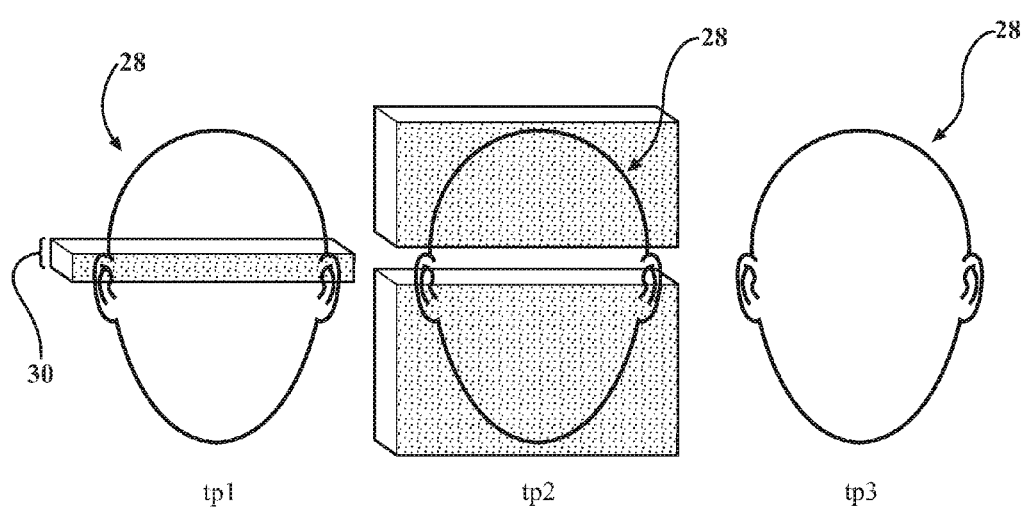
FIG. 6 is an illustrative imaging example of transverse magnetization patterns according to various time-points for a region of interest within a human head.

The MRI system 10 conventionally images a region of interest (ROI) 28 of the object 24. For simplicity, the ROI 28 is shown as a human head in FIGS. 1 and 6. The ROI 28 is imaged according to a plurality of slabs or slices 30. Only one of the plurality of slices 30 is illustrated in FIG. 6 for simplicity. Each slice 30 is generally a planar region having any suitable thickness, such as 10 mm. The MRI system 10 combines the slices 30 to construct an image of the ROI 28. The MRI system 10 may combine the slices 30 to construct a 2D image or a 3D image of the ROI 28 without departing from the scope of the present invention.

Figure 3:
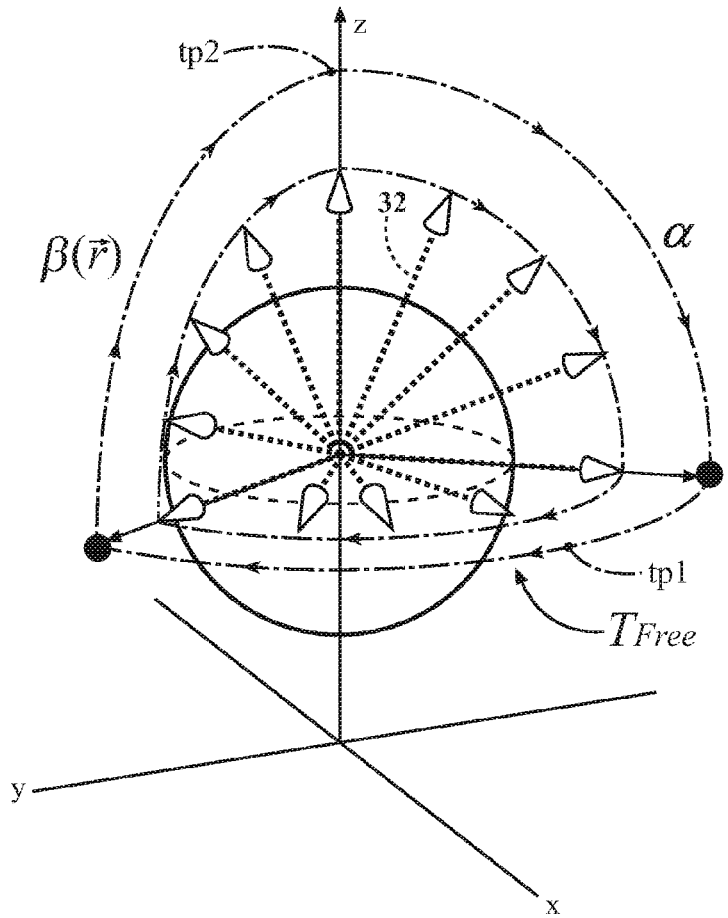
FIG. 3 is an illustration of a steady-state spin path for a single in-slice spin shown along a longitudinal axis (z) and a transverse plane (x, y)
Figure 4:
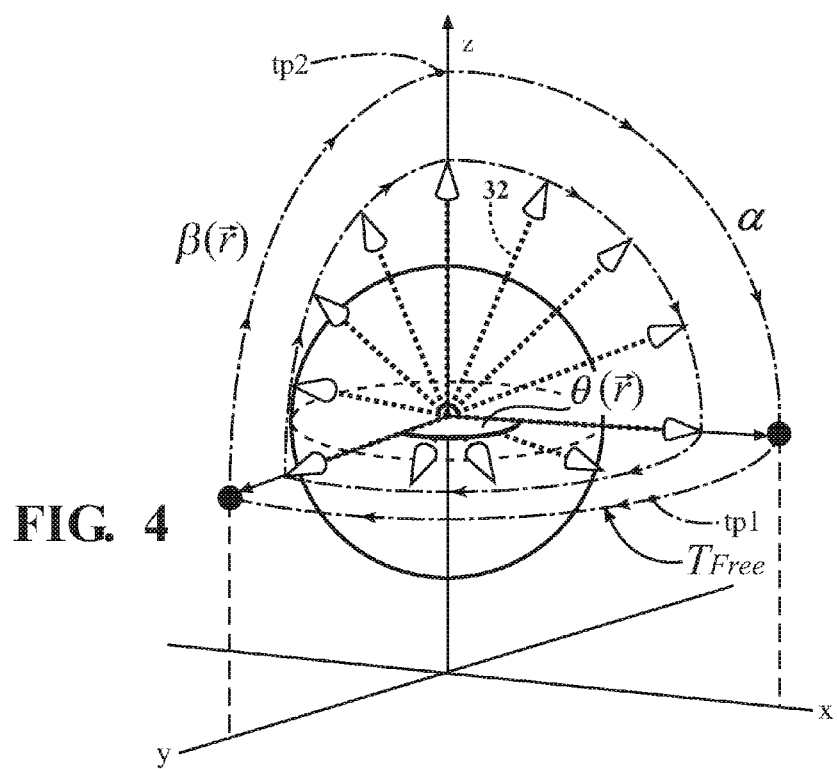
FIG. 4 is an illustration of the steady-state spin path for the in-slice spin shown specifically along the longitudinal axis (z) and a first transverse axis (x) and a second transverse axis (y) of the transverse plane (x, y)

The object 24 imaged by the MRI system 10 includes a plurality of atomic nuclei within organic matter such as tissue, bones, etc. In FIGS. 3 and 4, one atomic nucleus is shown as a sphere for exemplary purposes. Each of the atomic nuclei exhibits an intrinsic angular momentum such that each of the atomic nuclei spins about an axis. The axis represents a magnetic moment of the atomic nucleus. The magnetic moment of each of the atomic nuclei is hereinafter referred to as a spin. The spins are capable of moving within a frame of reference defined generally by the sphere.

Figure 8:
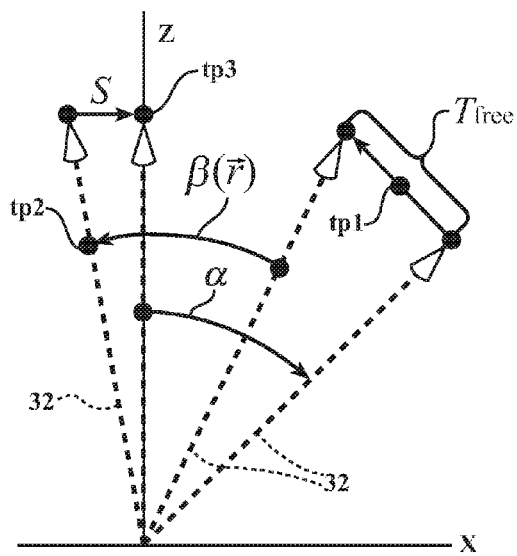
FIG. 8 is a 2D representation of the steady-state spin path of one of the in-slice spins shown along the first transverse axis (x) and the longitudinal axis (z), in the case of $\theta(\vec{r})=0$.
Figure 9:
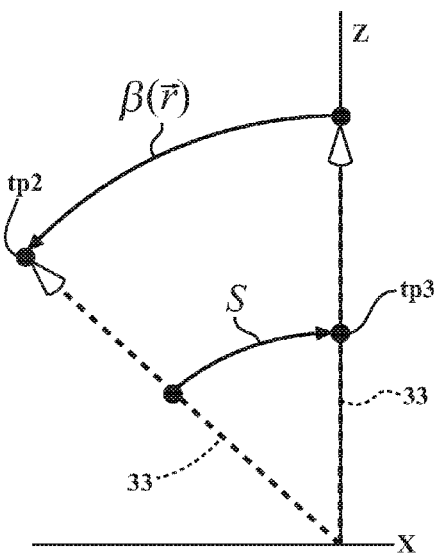
FIG. 9 is a 2D representation of the steady-state spin path of one of the out-of-slice spins shown along the first transverse axis (x) and the longitudinal axis (z), in the case of $\theta(\vec{r})=0$.

The ROI 28 includes a plurality of in-slice spins 32 within each respective slice 30 being imaged. The in-slice spins 32 release a nuclear magnetic resonance (NMR) signal for enabling acquisition of image data, as will be described below. The ROI 28 further includes a plurality of out-of-slice spins 33 outside each respective slice 30 being imaged within the ROI 28. For simplicity, a single in-slice spin 32 is shown in FIGS. 3, 4, and 8. Similarly, a single out-of-slice spin 33 is shown in FIG. 9. Each of the in-slice spins 32 and out-of-slice spins 33 include a single axis, however, to illustrate movement of the spins 32, 33, a plurality of axes are shown along a path of movement in FIGS. 3,4,8, and 9. As will be described below, the various components of the MRI system 10 manipulate the spins 32, 33 in order to generate the image.

The field magnet 12 produces a substantially homogeneous magnetic field through the bore 22 in which the object 24 is placed. The homogeneous magnetic field is hereinafter referred to as a B0 field. As shown in FIG. 1, the B0 field defines a longitudinal axis (z) which corresponds to an axis of the bore 22. In FIG. 1, the longitudinal axis (z) passes between the head of the object 24 and the feet of the object 24. The B0 field further defines a transverse plane (x, y) perpendicular to the longitudinal axis (z). The transverse plane (x, y) is defined by a first transverse axis (x) and a second transverse axis (y). In FIG. 1, the first transverse axis (x) passes horizontally through the object 24 and the second transverse axis (y) passes vertically through the object 24. In practice, the B0 field may not be perfectly homogenous and may vary in homogeneity along the object 24.

As will be described below, the ROI 28 of the object 24 is subjected to the B0 field. In turn, the in-slice spins 32 and out-of-slice spins 33 within the ROI 28 align with the longitudinal axis (z) of the B0 field. Transverse magnetization is generated as the spins 32, 33 rotate toward the transverse plane (x, y). The MRI system 10 is configured to detect the transverse magnetization and create image data based on the detected transverse magnetization.

The gradient coils 14 are typically driven by a gradient controller 34. As the gradient coils 14 are driven, the gradient coils 14 produce respective magnetic field gradients Gx, Gy, Gz for spatially encoding positions of the spins 32, 33. Magnetic field gradients Gx, Gy, Gz are generated along the first transverse axis (x), the second transverse axis (y), and the longitudinal axis (z), respectively. The gradient coils 14 apply the magnetic field gradients Gx, Gy, Gz to vary the B0 field linearly across the ROI 28 under imaging. The gradient coils 14 selectively superimpose the magnetic field gradients Gx, Gy, Gz on the B0 field to enable selective spatial excitation of the ROI 28. Spatial excitation may include slice-selective excitation. The gradient coils 14 also enable tailored excitations.

The MRI system 10 employs the RF coil 16 and the RF transmitter 18 to produce a sequence of RF pulses which are applied to the ROI 28. The sequence of RF pulses is applied to the spins 32, 33 generally to excite and temporarily manipulate the spins 32, 33. The MRI system 10 may employ any suitable method for producing the sequence of RF pulses, including but not limited to, methods employing a single channel or multi-channel transmission array.

The MRI system 10 includes the RF receiver 20 for receiving the NMR signal released by the in-slice spins 32. The MRI system 10 includes a processor 36 to process the NMR signals to form part of the image corresponding to the ROI 28 of the object 24. The MRI system 10 repeatedly applies the sequence of RF pulses and the magnetic field gradients Gx, Gy, Gz along several slices 30 of the ROI 28 to construct the entire image of the ROI 28. The processor 36 is connected to a display to provide the image of the ROI 28 on the display.

The MRI system 10 in FIG. 1 is intended to be a simplified and exemplary illustration. As such, the MRI system 10 may include other components not specifically shown in FIG. 1. Furthermore, it is to be appreciated that other MRI systems 10 may be capable of implementing the present invention.

Figure 2:
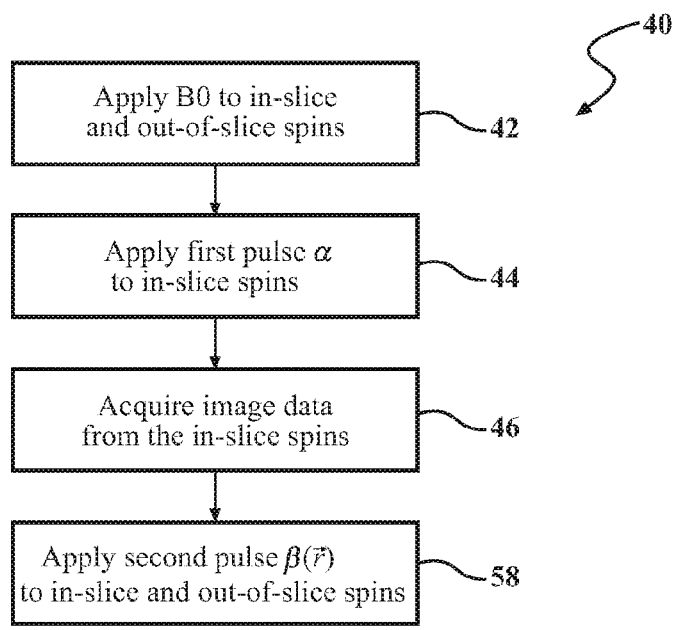
FIG. 2 is an exemplary flowchart illustrating steps of the method of acquiring image data from the object with the MRI system.
Figure 5:
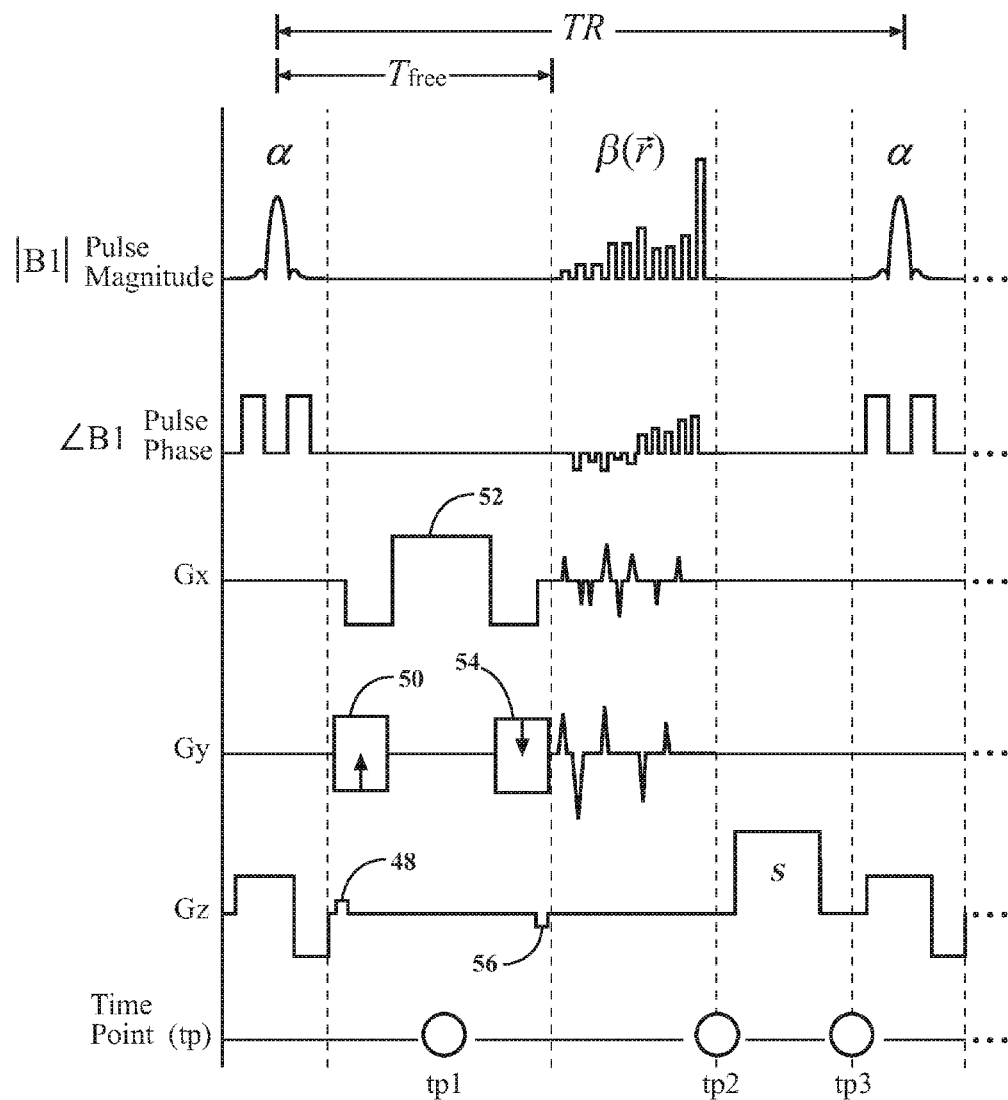
FIG. 5 is an exemplary pulse sequence diagram depicting an implementation of a sequence of RF pulses in accordance with the method.
Figure 7:
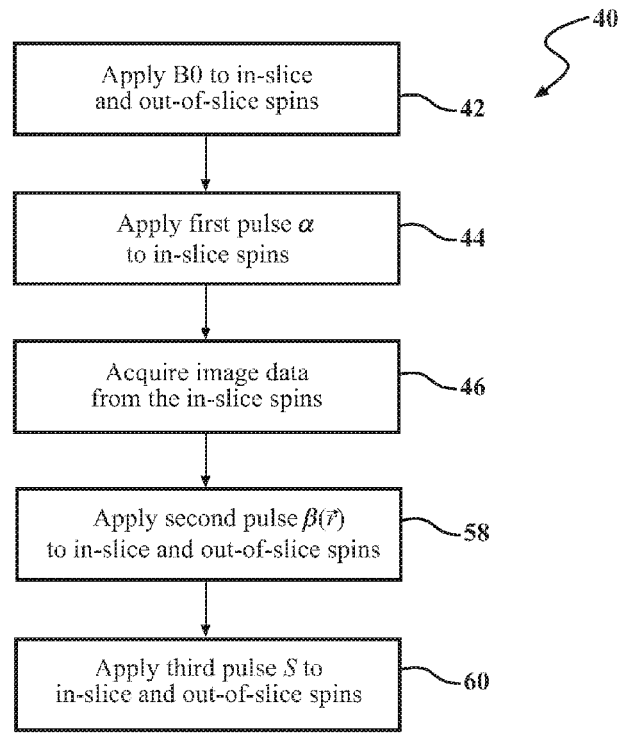
FIG. 7 is another exemplary flowchart illustrating steps of the method of acquiring image data from the object.

As illustrated in FIGS. 2 and 7, the MRI system 10 implements a method 40 of acquiring image data from the object 24. FIG. 5 illustrates an exemplary pulse sequence diagram depicting an implementation of the sequence of RF pulses in accordance with the method 40. In FIG. 5, time during sequence execution is indicated along the horizontal axis. The method 40 implements the sequence of RF pulses during the TR. As mentioned above, the TR is repeated during imaging. The TR defines generally the duration between successive sequences applied to the same slice 30.

At step 42, the B0 field is applied to the object 24 to align the in-slice spins 32 and out-of-slice spins 33 along the longitudinal axis (z). In other words, the in-slice spins 32 and out-of-slice spins 33 are oriented parallel to the longitudinal axis (z). Generally, the B0 field is continuously applied to the object 24 throughout the method 40 of acquiring image data.

At step 44, and as shown in FIG. 3, a first pulse α is applied to the in-slice spins 32 for rotating the in-slice spins 32 from the longitudinal axis (z) toward the transverse plane (x, y). The first pulse α is an RF pulse in the sequence which is applied during the TR. As shown in FIG. 5, the TR may be defined between application of the first pulse α and application of a subsequent first pulse α. The sequence is generally repeated after application of the subsequent first pulse α. The first pulse α is slice-selective, and therefore, is applied to the in-slice spins 32 for each respective slice 30. The first pulse α is designed to excite the desired imaging region. In so doing, the first pulse α defines the 2D slice or 3D region to be imaged. For example, as shown in FIG. 5, a magnetic field gradient Gz is applied in conjunction with the first pulse α to enable selective excitation of a slice 30 axially along the longitudinal (z). It is to be understood that a slices 30 of arbitrary orientation can be imaged, such as sagittal, coronal, or oblique slices.

As shown in FIG. 3, the first pulse α is configured to tip the in-slice spins 32 toward the transverse plane (x, y) according to a tip-down angle. The tip-down angle is typically defined between 0 and 90 degrees. The preferred tip-down angle may be different for various types of organic matter being imaged. For example, the tip-down angle is preferably 16 degrees for imaging gray matter at 3 Tesla. For simplicity, the term "down" in reference to the tip-down angle refers to the tip direction of the in-slice spins 32 relative to the spatial orientation of the longitudinal axis (z) and the transverse plane (x, y) as depicted in FIGS. 3 and 4.

However, the term "down" is not intended to limit the scope of the first pulse α or the tip-down angle.

In FIG. 5, the first pulse α is typically implemented according to a pulse magnitude |B1| corresponding to a sinc function. However, the first pulse α may be implemented according to other design methods such as a Shinnar-Le Roux algorithm, and the like. Furthermore, the first pulse α may be of any suitable duration, but is preferably less than 1 ms.

In FIG. 4, the first pulse α may rotate each of the in-slice spins 32 directly about the first transverse axis (x). In such instances, the step 44 of applying the first pulse α to the in-slice spins 32 may be further defined as rotating the in-slice spins 32 according to the tip-down angle from the longitudinal axis (z) to the first transverse axis (x) within the transverse plane (x, y). Alternatively, the first pulse α may rotate each of the in-slice spins 32 directly about second transverse axis (y). In such instances, the step 44 of applying the first pulse α to the in-slice spins 32 may be further defined as rotating the in-slice spins 32 according to the tip-down angle from the longitudinal axis (z) to the second transverse axis (y) within the transverse plane (x, y). It is to be appreciated that the first pulse α may have any arbitrary phase (direction) and need not be aligned precisely with the first transverse axis (x) or the second transverse axis (y).

The method 40 may include the step of acquiring a B0 map from the object 24. As used herein, the term "B0 map" defines generally the map of a resonance frequency offset $\omega(\vec{r})$ which is given according to the following equation:

$$\omega(\vec{r}) = \gamma^* \Delta B0(\vec{r}) \quad [1]$$

In equation [1], γ is the Larmor frequency, $\Delta B0(\vec{r})$ is the local B0 inhomogeneity, and $\vec{r} = (x, y, z)$ represents the spatial coordinate. The MRI system 10 may employ any suitable method for detecting the local resonance frequency offset $\omega(\vec{r})$ arising as a result of local variations in the homogeneity of the B0 field.

The B0 map may be acquired from the object 28 for determining magnetization characteristics of the in-slice spins 32. The B0 map includes information regarding static field characteristics of the in-slice spins 32. More specifically, the B0 map includes static field strength correlating to specific resonant frequencies of the in-slice spins 32 in the ROI 28. The B0 map may be acquired by the MRI system 10 according to any suitable means, such as a spoiled steady-state sequence, and the like. The B0 map may be utilized to implement a second pulse $\beta(\vec{r})$, as will be described below.

At step 46, image data is acquired from the in-slice spins 32 during a free precession interval ($T_{free}$) in which the in-slice spins 32 precess in the transverse plane (x, y). Theoretically, it may be understood that the in-slice spins 32 include a transverse component which precesses in the transverse plane (x, y). The in-slice spins 32 precess by a spatially-dependent precession angle $\theta(\vec{r})$ proportional to the local B0 inhomogeneity $\Delta B0(\vec{r})$. As shown generally in Figures, the moment during which image data is acquired during $T_{free}$ is identified according to time-point one (tp1). However, image data may be acquire at any moment during $T_{free}$. At tp1 in FIG. 6, the NMR signals acquired from the in-slice spins 32 provide image data for the slice 30 being imaged. Accordingly, image data for the slice 30 is processed by the MRI system 10 and the slice 30 is displayed.

The duration of $T_{free}$ may be any suitable duration for any given ROI 28. In one embodiment, $T_{free}$ is approximately 10 ms.

In FIG. 5, after the first pulse α is applied, magnetic field gradient Gz may provide a first out-of-slice dephaser 48 to dephase out-of-slice steady-state signal existing during $T_{free}$. The out-of-slice dephaser 48 is applied to an area that is small enough such that a total dephasing occurring across an imaging voxel is substantially minimal, i.e., less than one cycle. Magnetic field gradient Gy provides an encoding gradient 50 during $T_{free}$ for locating the NMR signals. The encoding gradient 50 alters the phase of in-slice spins 32 along the second transverse axis (y). Magnetic field gradient Gx provides a readout gradient 52 during $T_{free}$ for frequency encoding and collecting data of the object 24 being imaged. After the readout gradient 52, magnetic field gradient Gy further provides a rewinder gradient 54 during $T_{free}$ that has equal amplitude but opposite polarity as the encoding gradient 50. The rewinder gradient 54 is applied after data collection for cancelling phase encoding by the encoding gradient 50. By doing so, the rewinder gradient 54 ensures that a similar net phase is provided during data readout for a subsequent TR. Optionally, magnetic field gradient Gz may further provide a second out-of-slice dephaser 56 during $T_{free}$ that has equal amplitude but opposite polarity as the first out-of-slice dephaser 48. The second out-of-slice dephaser 56 is applied after data collection for cancelling dephasing from the first out-of-slice dephaser 48 before the start of a subsequent TR. The two out-of-slice dephaser gradients 48, 56 substantially dephase out-of-slice magnetization, which suppresses unwanted contribution of out-of-slice spins 33 to the acquired signal. The out-of-slice dephaser gradients 48, 56 are utilized in addition to, and complementary to, a third pulse S, which consists of an unbalanced gradient and/or RF-spoiling, as will be described in greater detail below.

The step 46 of acquiring image data from the in-slice spins 32 during $T_{free}$ occurs typically after the step 44 of applying the first pulse α. Said differently, the first pulse α rotates the in-slice spins 32 from the longitudinal axis (z) toward the transverse plane (x, y) and then image data is acquired as the in-slice spins 32 precess in the transverse plane (x, y). The step 46 of acquiring image data may be implemented by any suitable 2D or 3D readout technique, such as spiral, radial, or echo-planar readout technique. Specifically, the imaging gradients 50, 52, 54 in FIG. 5 could be replaced with spiral, radial, or echo-planar imaging gradients without departing from the scope of the invention.

The step 46 of acquiring image data may be further defined as acquiring image data during $T_{free}$ in which the in-slice spins 32 precess according to the precession angle $\theta(\vec{r})$. The precession angle $\theta(\vec{r})$ is expressed as follows:

$$\theta(\vec{r}) = \omega(\vec{r}) T_{free} \quad [2]$$

In one embodiment, as shown in FIG. 4, the in-slice spins 32 precess according to $\theta(\vec{r})$, whereby $\theta(\vec{r})$ is equal to 90 degrees. In the embodiment illustrated in FIG. 4, the in-slice spins 32 precess during $T_{free}$ from the first transverse axis (x) directly to the second transverse axis (y). Of course, $\theta(\vec{r})$ need not be equal to 90 degrees. In another embodiment, $\theta(\vec{r})$ may be slightly less than or greater than 90 degrees. As used herein the term "precession angle" may also be described as a phase of the in-slice spin 32.

At step 58, a second pulse $\beta(\vec{r})$ is applied to the in-slice spins 32 for rotating the in-slice spins 32 from the transverse plane (x, y) to at least substantially along the longitudinal axis (z). As shown throughout the Figures, the moment immediately after the second pulse $\beta(\vec{r})$ is applied is identified according to time-point two (tp2). As shown in FIGS. 3 and 4, the second pulse $\beta(\vec{r})$ interrupts precession of the in-slice spins 32 in the transverse plane (x, y) by rotating the in-slice spins 32 toward the longitudinal axis (z). In so doing, the second pulse $\beta(\vec{r})$ substantially eliminates transverse magnetization exhibited by the in-slice spins 32. As such, the NMR signal is substantially suppressed for the slice 30 being imaged, as shown at tp2 in FIG. 6. By interrupting precession of the in-slice spins 32, the second pulse $\beta(\vec{r})$ substantially reduces the duration of the TR required to achieve a given longitudinal magnetization prior to application of the first pulse α. In turn, the MRI system 10 is capable of providing reduced scan-time.

As shown in FIG. 5, the second pulse $\beta(\vec{r})$ is an RF pulse which is applied during the TR of the sequence. For any given TR, application of the second pulse $\beta(\vec{r})$ generally occurs after the acquisition of image data from the in-slice spins 32 during $T_{free}$. In FIG. 5, $T_{free}$ begins during application of the first pulse α and ends at the start of the second pulse $\beta(\vec{r})$. The second pulse $\beta(\vec{r})$ may be of any suitable duration. In one example, the second pulse $\beta(\vec{r})$ is less than 2 ms.

The second pulse $\beta(\vec{r})$ acts as a "tip-up" pulse for tipping the in-slice spins 32 toward the longitudinal axis (z). The notation "$\beta(\vec{r})$", as used herein, is intended to convey that second pulse $\beta(\vec{r})$ is spatially tailored to a desired imaging region, which is generally either a 2D slice or a 3D region. The imaging region need not be oriented in the transverse plane (x, y) defined axially by the B0 field. As mentioned above, the imaging region can have any spatial orientation, such as sagittal, coronal, or oblique. For simplicity, the term "up," as used herein with respect to the second pulse $\beta(\vec{r})$ refers to the tip direction of the in-slice spins 32 relative to the spatial orientation of the longitudinal axis (z) and the transverse plane (x, y) as depicted in FIGS. 3 and 4. However, the term "up" is not intended to limit the scope of the second pulse $\beta(\vec{r})$.

In one embodiment, the first pulse α can be spatially tailored to a desired imaging region, resulting in a spatially tailored first pulse $\alpha(\vec{r})$. In principle, the spatially tailored first pulse $\alpha(\vec{r})$ and the second pulse $\beta(\vec{r})$ can be configured to ensure that minimal residual transverse magnetization exists after application of the second pulse $\beta(\vec{r})$. The B0 map may be utilized to define the local free precession angle $\theta(\vec{r})$ for the in-slice spins 32. The second pulse $\beta(\vec{r})$ is tailored to the local free precession angle $\theta(\vec{r})$ of each in-slice spin 32.

The second pulse $\beta(\vec{r})$ is non-slice-selective, and therefore, is applied to the in-slice spins 32 for each respective slice 30 as well as the out-of slice spins 33 disposed in relation to the respective slice 30. As shown in FIG. 5, the second pulse $\beta(\vec{r})$ is applied absent a through-plane magnetic field gradient (e.g., Gz) for enabling tip-up excitation by the second pulse $\beta(\vec{r})$ to be non-slice-selective. By having the second pulse $\beta(\vec{r})$ be non-slice-selective, complexity of the second pulse $\beta(\vec{r})$ is reduced and the second pulse $\beta(\vec{r})$ is implemented over a shorter duration than a slice-selective second pulse $\beta(\vec{r})$.

The second pulse $\beta(\vec{r})$ may be implemented according to any suitable method for providing a non-slice-selective, spatially tailored tip-up RF pulse. Specifically, the MRI system 10 may employ any suitable multi-dimensional RF design and/or parallel transmit array method. For example, the MRI system 10 may employ a 2D RF pulse using spiral in-plane gradients with no through-plane gradient to tailor the tip-up excitation to a 2D imaging slice. In another example, a 3-dimensional RF pulse using non-zero Gx, Gy, and Gz gradients may be utilized to tailor the tip-up excitation to a 3D imaging volume. In another example, the MRI system 10 may utilize only one non-zero gradient direction (1D pulses) to tailor the tip-up excitation. In yet another example, no gradients are utilized during application of the second pulse $\beta(\vec{r})$ (0D pulses) to tailor the tip-up excitation. For example, the second pulse $\beta(\vec{r})$ can be designed by designing an intermediate tip-down excitation consisting of temporally varying RF waveform(s) $B1_{int}(t)$ and gradients $Gx_{int}(t)$, $Gy_{int}(t)$, and $Gz_{int}(t)$. In the design of the intermediate tip-down excitation, the negative of the measured B0 field inhomogeneity, i.e. $-\omega(\vec{r})$, may be used. The tip-up pulse can then be designed by negating and/or time-reversing one or more of the intermediate waveforms. The second pulse $\beta(\vec{r})$ may be made non-slice-selective and spatially tailored according to other suitable methods not specifically recited herein.

The step 58 of applying the second pulse $\beta(\vec{r})$ to in-slice spins 32 may be further defined as simultaneously applying the second pulse $\beta(\vec{r})$ to out-of-slice spins 33 for rotating out-of-slice spins 33 from the longitudinal axis (z) toward the transverse plane (x, y), as shown at tp2 in FIG. 9. As mentioned above, the second pulse $\beta(\vec{r})$ is non-slice-selective. At tp2 in FIG. 6, out-of-slice spins 33 are excited upon application of the second pulse $\beta(\vec{r})$ such that the out-of-slice spins 33 produce transverse magnetization in the transverse plane (x, y).

The second pulse $\beta(\vec{r})$ is configured to tip-up the in-slice spins 32 according to a tip-up phase. The tip-up phase may be designed such that each of the in-slice spins 32 aligns substantially parallel with the longitudinal axis (z). The tip-up phase is preferably defined between 0 and 90 degrees. However, the tip-up phase may be different for each one of the respective in-slice spins 32. In one example, the tip-up phase of the second pulse $\beta(\vec{r})$ corresponds to the tip-down angle of the first pulse $\alpha$.

The method 40 may include the step of implementing the second pulse $\beta(\vec{r})$ as a function of the B0 map acquired from the object 24. The second pulse $\beta(\vec{r})$ may be customized based upon the local resonance frequency offset to $\omega(\vec{r})$ corresponding to the respective ROI 28. The second pulse $\beta(\vec{r})$ includes a tip-up magnitude and a tip-up phase. The step of generating the second pulse $\beta(\vec{r})$ as a function of the B0 map may be further defined as computing the tip-up magnitude and/or tip-up phase for each of the in-slice spins 32 as a function of the B0 map. The tip-up phase and/or tip-up magnitude of the second pulse $\beta(\vec{r})$ are tailored to the in-slice spins 32 that are being exposed to the second pulse $\beta(\vec{r})$. Accordingly, the second pulse $\beta(\vec{r})$ compensates for inhomogeneity in the B0 field and mitigates the effects of resonance frequency offset $\omega(\vec{r})$ thereby reducing signal variations.

As mentioned above, the second pulse $\beta(\vec{r})$ substantially eliminates transverse magnetization exhibited by the in-slice spins 32 by rotating the in-slice spins 32 toward the longitudinal axis (z). In some embodiments, the second pulse $\beta(\vec{r})$ entirely eliminates transverse magnetization. In other embodiments, the second $\beta(\vec{r})$ substantially eliminates transverse magnetization.

In practice, and as shown in FIG. 8, the second pulse $\beta(\vec{r})$ may not perfectly rotate each of the in-slice spins 32 to the longitudinal axis (z). In such instances, transverse magnetization may exist. In some instances transverse magnetization may exist because of a phase mismatch $\Delta\theta$, as shown in FIG. 4. The phase mismatch $\Delta\theta$ may be defined as a difference between the phase of the second pulse $\beta(\vec{r})$ and the phase $\theta(\vec{r})$ of the local in-slice spins 32. In the event of such a phase mismatch $\Delta\theta$, the following equation describes an effective transverse relaxation rate to be substituted for T2 in Eq. [4] described below:

$$T2_{eff} \equiv \frac{T2 T_{free}}{T_{free} - T2\ln(\cos(\Delta\theta))} (\Delta\theta \neq 0) \qquad [3]$$

In equation [3], $T2_{eff}$ generally defines an effective transverse relaxation rate and T2 defines a transverse relaxation time decay constant.

In some embodiments, the phase mismatch $\Delta\theta$ may be equal to zero. In such instances, the second pulse $\beta(\vec{r})$ perfectly aligns the in-slice spins 32 with the longitudinal axis (z). In other embodiments, the phase mismatch $\Delta\theta$ may be non-zero. In such instances, although the second pulse $\beta(\vec{r})$ may substantially align the in-slice spins 32 with the longitudinal axis (z), the in-slice spins 32 may not be aligned perfectly along the longitudinal axis (z).

For specific applications, the phase mismatch $\Delta\theta$ may be intentionally designed to be non-zero. In such instances, the phase of the second pulse $\beta(\vec{r})$ may be intentionally mismatched to correspond with the non-zero phase mismatch $\Delta\theta$. For instance, such an application may be utilized to partially suppress signal from certain parts of the image, or from certain tissue types, e.g., fat tissue, based on the off-resonance (B0) frequency of the specific tissue type.

At step 60 in FIG. 7, a third pulse S may be applied to the in-slice spins 32 for aligning the in-slice spins 32 to the longitudinal axis (z). The third pulse S may also be applied to the out-of-slice spins 33 for aligning out-of-slice spins 33 to the longitudinal axis (z). The third pulse S may be applied to eliminate residual transverse magnetization. In one embodiment, the residual transverse magnetization may occur from the in-slice spins 32 not being aligned along the longitudinal axis (z) after application of the second pulse $\beta(\vec{r})$. In another embodiment, the residual transverse magnetization occurs from the out-of-slice spins 33 not being aligned along the longitudinal axis (z) after application of the second pulse $\beta(\vec{r})$. However, it is to be appreciated that residual transverse magnetization may exist even where the second pulse $\beta(\vec{r})$ may not perfectly rotate each of the in-slice spins 32 and out-of-slice spins 33 to the longitudinal axis (z). For instance, residual transverse magnetization may exist because of T1 and T2 relaxation.

The step 60 of applying the third pulse S may be further defined as aligning the in-slice spins 32 to the longitudinal axis (z). As shown in FIG. 8, the in-slice spins 32 may be slightly misaligned with the longitudinal axis (z) after application of the second pulse $\beta(\vec{r})$. In such instances, application of the third pulse S ensures that the in-slice spins 32 are oriented parallel to the longitudinal axis (z).

As discussed above, the second pulse $\beta(\vec{r})$ also rotates the out-of-slice spins 33 substantially toward the longitudinal axis (z). However, as shown in FIG. 9, the out-of-slice spins 33 may be slightly misaligned with the longitudinal axis (z) after application of the second pulse $\beta(\vec{r})$. The step 60 of applying the third pulse S may be further defined as aligning the out-of-slice spins 33 from the transverse plane (x, y) to the longitudinal axis (z). By doing so, the out-of-slice spins 33 become oriented parallel to the longitudinal axis (z). The third pulse S may simultaneously align the in-slice spins 32 and the out-of-slice spins 33 to the longitudinal axis (z).

The phrase "pulse S" is used herein in a general sense and may be construed to include a physical gradient pulse as shown in FIG. 5, and the application of quadratic RF phase-cycling (linear phase increment from TR-to-TR, as will be described below). The step 60 of applying the third pulse S typically occurs after the step 58 of applying the second pulse $\beta(\vec{r})$ and before completion of the TR. As shown generally throughout the Figures, the moment immediately after the third pulse S is applied is identified according to time-point three (tp3). As illustrated at tp3 in FIG. 6, residual transverse magnetization by the in-slice spins 32 and out-of-slice spins 33 is suppressed such that no NMR signal exists immediately after the third pulse S.

The step 60 of applying the third pulse S may be further defined as applying an unbalanced gradient to eliminate residual transverse magnetization. In one embodiment, the third pulse S is implemented as a through-plane magnetic field gradient applied after the second pulse $\beta(\vec{r})$. In one example, as shown in FIG. 5, the through-plane magnetic field gradient is magnetic field gradient Gz for an axial slice. In such instances, the magnetic field gradient Gz is unbalanced such the phase of the spins existing before application of the magnetic field gradient Gz is generally not preserved after application of the magnetic field gradient Gz. The third pulse S may implement the magnetic field gradient Gz pursuant to a predetermined waveform configured to dephase the in-slice spins 32 and out-of-slice spins 33 such that the in-slice spins 32 and out-of-slice spins 33 are incoherently orientated before the end of the TR. Thus, the method 40 generally employs incoherent imaging. That is, spins 32 imaged within a slice 30 undergo motion according to phases, velocities, and directions different than other spins 32 within the same slice 30. It is to be understood that the unbalanced gradient can be applied along any spatial direction, although it would generally be advantageously applied along the largest voxel dimension (typically through-slice).

The step 60 of applying the third pulse S may be further defined as applying RF-spoiling to eliminate residual transverse magnetization. In RF-spoiling, the third pulse S represents successive RF transmissions according to different phases to excite the in-slice spins 32 and out-of-slice spins 33. Specifically, RF phase is incremented by an amount $\phi*n$, where n is the TR number, and $\phi$ is a constant value (such as $\phi=117°$ or $\phi=108°$). Generally, the same phase increment $\phi*n$ is applied to both the first pulse $\alpha$ and the second pulse $\beta(\vec{r})$ to ensure accurate tip-up pulse performance. The purpose of applying RF-spoiling is to eliminate transverse signal from out-of-slice spins 33 that may exist at the time of image acquisition (tp1). RF-spoiling may be implemented using any suitable linear phase increment. However, it is to be understood that other phase cycling schemes, such as random phase cycling schemes, can also be used even if such schemes do not ensure a theoretically stable steady-state signal formation. Alternatively, quasi-random phase cycling can be achieved by other means, e.g. by varying the area of the unbalanced gradient waveform of the third pulse S. Furthermore, the optimal value of $\phi$ may be application-dependent. The step 60 of applying the third pulse S may be defined as simultaneously applying an unbalanced gradient and RF-spoiling to eliminate residual transverse magnetization.

In theory, the NMR signal acquired in accordance with the present invention may be described under ideal conditions. In steady-state, the NMR signal immediately after the first pulse $\alpha$ can be expressed as follows:

$$M_t = M_0 \frac{e^{-\frac{T_S}{T1}}\left(1-e^{-\frac{T_{free}}{T1}}\right)\sin\alpha\cos\beta(\vec{r}) + \left(1-e^{-\frac{T_S}{T1}}\right)\sin\alpha}{1 - e^{-\frac{T_S}{T1}-\frac{T_{free}}{T2}}\sin\alpha\sin\beta(\vec{r}) - e^{-\frac{T_S}{T1}-\frac{T_{free}}{T1}}\cos\alpha\cos\beta(\vec{r})} \quad [4]$$

In equation [4], Ts is defined as the delay required for the third pulse S, T1 defines the longitudinal relaxation time decay constant, and T2 defines the transverse relaxation time constant. Equation [4] predicts that the NMR signal includes T1 and T2 weighting, i.e. imaging whereby signal contrast is predominately determined by differences in longitudinal and transverse relaxation times of spins 32, 33 for different tissues.

It is to be appreciated that the principles described herein may be utilized to perform transient, non-steady-state imaging. Specifically, non-steady-state imaging may be achieved by applying the same sequence of the first pulse $\alpha$, the second pulse $\beta(\vec{r})$, and the third pulse S in rapid succession with a suitable RF phase cycling scheme.

The present invention has been described herein in an illustrative manner. It is to be understood that the terminology which has been used is intended to be in the nature of words of description rather than of limitation. Obviously, many modifications and variations of the invention are possible in light of the above teachings. The invention may be practiced otherwise than as specifically described within the scope of the appended claims.

What is claimed is:

1. A method of acquiring image data with an MRI system from an object according to a plurality of slices, with the object including a plurality of in-slice spins within each respective slice and a plurality of out-of-slice spins outside each respective slice, said method comprising the steps of:
   applying a magnetic field to the object to align the in-slice spins and the out-of-slice spins along a longitudinal axis;
   acquiring a B0 map from the object for determining magnetization characteristics of the in-slice spins;
   generating a first pulse as a function of the B0 map, the first pulse being slice-selective;

applying the first pulse to the in-slice spins for rotating the in-slice spins from the longitudinal axis toward a transverse plane;

acquiring image data from the in-slice spins during a free precession interval in which the in-slice spins precess in the transverse plane;

generating a second pulse as a function of the B0 map, the second pulse being non-slice-selective and spatially tailored; and applying the second pulse to the in-slice spins for rotating the in-slice spins from the transverse plane to at least substantially along the longitudinal axis.

2. The method of claim 1 wherein the step of generating the second pulse as a function of the B0 map is further defined as utilizing the B0 map to define a precession angle for the in-slice spins.

3. The method of claim 2 wherein the step of generating the second pulse as a function of the B0 map is further defined as computing a tip-up phase for the in-slice spins as a function of the precession angle for the in-slice spins.

4. The method of claim 1 further comprising the step of applying a third pulse to the in-slice and the out-of-slice spins.

5. The method of claim 4 wherein the step of applying the third pulse is further defined as applying the third pulse to the in-slice spins for aligning the in-slice spins to the longitudinal axis.

6. The method of claim 4 wherein the step of applying the third pulse is further defined as applying third pulse to the out-of-slice spins for aligning the out-of-slice spins to the longitudinal axis.

7. The method of claim 4 wherein the step of applying the third pulse is further defined as applying the third pulse to the in-slice spins and the out-of-slice spins for aligning the in-slice spins and the out-of-slice spins to the longitudinal axis.

8. The method of claim 4 wherein the step of applying the third pulse is further defined as applying an unbalanced gradient.

9. The method of claim 4 wherein the step of applying the third pulse is further defined as applying RF-spoiling.

10. The method of claim 4 wherein the step of applying the third pulse is further defined as applying an unbalanced gradient and RF-spoiling.

11. The method of claim 4 wherein the step of applying the third pulse occurs for eliminating residual transverse magnetization resulting from the in-slice spins not being aligned along the longitudinal axis after application of the second pulse.

12. The method of claim 4 wherein the step of applying the third pulse occurs for eliminating residual transverse magnetization resulting from the out-of-slice spins not being aligned along the longitudinal axis after application of the second pulse.

13. The method of claim 4 wherein the step of applying the first pulse occurs after the step of applying the magnetic field to the object, wherein the step of acquiring image data occurs after the step of applying the first pulse, wherein the step of applying the second pulse occurs after the step of acquiring image data, and wherein the step of applying the third pulse occurs after the step of applying the second pulse.

14. The method of claim 1 wherein the step of applying the first pulse to the in-slice spins occurs without rotating the out-of-slice spins.

15. The method of claim 1 wherein the step of applying the second pulse to the in-slice spins is further defined as applying the second pulse to the out-of-slice spins.

16. An MRI system configured to acquire image data from an object according to a plurality of slices, with the object including a plurality of in-slice spins within each respective slice and a plurality of out-of-slice spins outside each respective slice, and with the MRI system configured to acquire a B0 map from the object to determine magnetization characteristics of the in-slice spins, said MRI system comprising:

a field magnet configured to generate a magnetic field through the object to align the in-slice spins and the out-of-slice spins along a longitudinal axis;

an RF transmitter configured to apply a sequence of RF pulses for manipulating orientation of the in-slice and out-of-slice spins, said RF transmitter configured to apply a first pulse to the in-slice spins for rotating the in-slice spins from the longitudinal axis toward a transverse plane and with first pulse being generated as a function of the B0 map and being slice-selective; and an RF receiver configured to acquire image data from the in-slice spins during a free precession interval in which the in-slice spins precess in the transverse plane;

wherein said RF transmitter is configured to apply a second pulse to the in-slice spins for rotating the in-slice spins from the transverse plane to at least substantially along the longitudinal axis and with second pulse being generated as a function of the B0 map and being non-slice-selective and spatially tailored.

17. The Mill system of claim 16 wherein said RF transmitter is further configured to apply a third pulse to the in-slice spins and out-of-slice spins to align the in-slice spins and-out-of-slice spins to the longitudinal axis for eliminating residual transverse magnetization.

18. The Mill system of claim 17 wherein said third pulse is implemented by at least one of an unbalanced gradient and RF-spoiling.

19. The MRI system of claim 16 further being configured to utilize the B0 map to define a precession angle for the in-slice spins.

20. The MRI system of claim 19 further being configured to compute a tip-up phase for the in-slice spins as a function of the precession angle for the in-slice spins.

* * * * *